(12) United States Patent
Kinch

(10) Patent No.: US 7,608,830 B1
(45) Date of Patent: Oct. 27, 2009

(54) SEPARATE ABSORPTION AND DETECTION DIODE FOR TWO-COLOR OPERATION

(75) Inventor: Michael A. Kinch, Dallas, TX (US)

(73) Assignee: DRS Sensors & Targeting Systems, Inc., Palm Bay, FL (US)

(\*) Notice: Subject to any disclaimer, the term of this patent is extended or adjusted under 35 U.S.C. 154(b) by 496 days.

(21) Appl. No.: 11/249,755

(22) Filed: Oct. 13, 2005

Related U.S. Application Data

(60) Provisional application No. 60/718,840, filed on Sep. 20, 2005.

(51) Int. Cl.
G01T 1/24 (2006.01)
G01J 5/20 (2006.01)

(52) U.S. Cl. .................. 250/370.06; 250/338.4

(58) Field of Classification Search ........... 250/338.4, 250/370.06
See application file for complete search history.

(56) References Cited

U.S. PATENT DOCUMENTS

| | | | |
|---|---|---|---|
| 4,374,678 A | 2/1983 | Castro | |
| 4,492,763 A | 1/1985 | Trotta et al. | |
| 4,567,849 A | 2/1986 | Wan | |
| 4,686,373 A | 8/1987 | Tew et al. | |
| 4,961,098 A | 10/1990 | Rosbeck et al. | |
| 5,189,297 A | 2/1993 | Ahlgren | |
| 5,279,974 A | 1/1994 | Walsh | |
| 6,049,116 A | 4/2000 | Park et al. | |
| 6,603,184 B2 | 8/2003 | Lin et al. | |
| 2002/0125472 A1* | 9/2002 | Johnson et al. | 257/21 |
| 2006/0162768 A1* | 7/2006 | Wanlass et al. | 136/262 |

OTHER PUBLICATIONS

R. Ashokan, et al., "Mercury Cadmium Telluride for High Operating Temperature Infrared Detectors", MicroPhysics Laboratory, Dept. of Physics, University of Illinois at Chicago.
P. Migliorato, et al., "Common Anion Heterojunctions: CdTe-CdHgTe", Solid-State Electronics vol. 26, No. 1, pp. 65-69, 1983.
Peter R. Bratt, "HgCdTe heterojunctions", J. Vac. Sci. Technol. A 1 (3), Jul.-Sep. 1983, pp. 1687-1691.

\* cited by examiner

*Primary Examiner*—David P Porta
*Assistant Examiner*—Carolyn Igyarto
(74) *Attorney, Agent, or Firm*—Sonnenschein Nath & Rosenthal LLP

(57) ABSTRACT

A photodiode for detection of preferably infrared radiation capable of detecting two different wavelengths wherein photons are absorbed in one region and detected in another. In one example embodiment, an absorbing P region is abutted with an N region of lower doping such that the depletion region is substantially (preferably completely) confined to the N region. The N region is also chosen with a larger bandgap than the P region, with compositional grading of a region of the N region near the P region. This compositional grading mitigates the potential barrier between the respective bandgaps. Under first voltage conditions a potential barrier prevents minority carriers from moving from the P region to the N region, but photons of energy large enough to generate minority carriers within the N region are detected. Under reverse bias, the barrier is substantially reduced or disappears, allowing charge carriers to move from the absorbing P region into the N region (and beyond) where they are detected. Thus, under reverse bias, both wavelengths of energy can be detected, and separated by differencing the output.

11 Claims, 11 Drawing Sheets

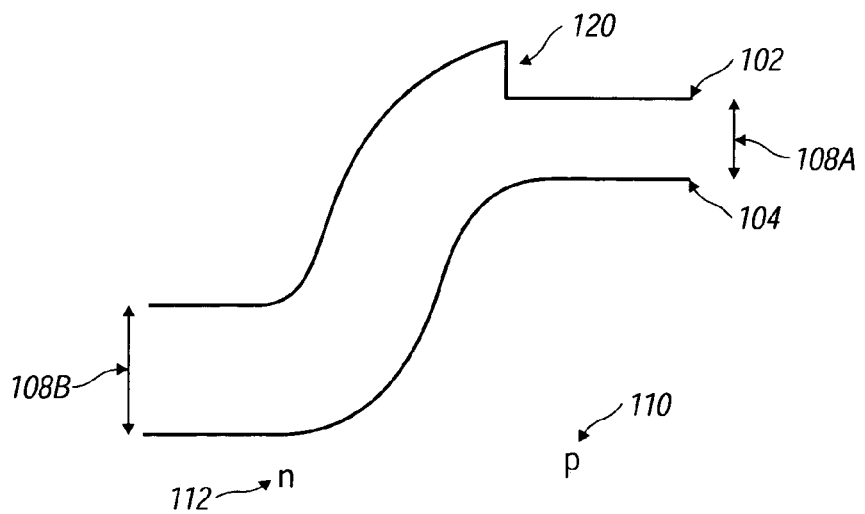
FIG. 1C
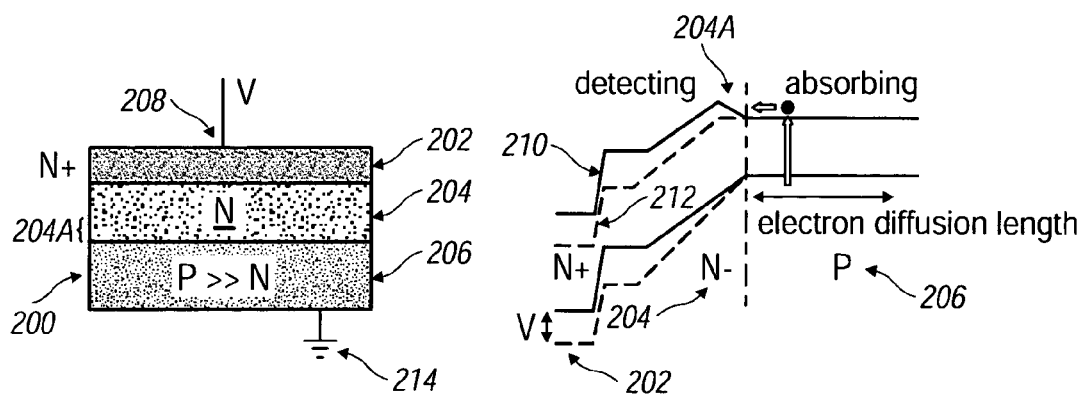
FIG. 2A     FIG. 2B

Direct Tunnel Current vs HgCdTe Bandgap for Various Electric Fields

CTIA (charge trans-impedance amplifier) input circuit for SAD diode

N+/P-/P and N+/N-/P SAD hetero-structures showing the doping, charge and electric field profiles. For n-, and p- doping levels ~ 1014cm-3 and W ~ 1um, then for any reasonable applied voltage the depletion punches all the way through W, and the field at the edge of the transition region approximates V/W, where V is the applied voltage.

SEPARATE ABSORPTION AND DETECTION DIODE FOR TWO-COLOR OPERATION

CROSS-REFERENCE TO RELATED APPLICATIONS

This application claims priority from U.S. provisional patent application 60/718,840 filed on Sep. 20, 2005, which is hereby incorporated by reference.

BACKGROUND AND SUMMARY OF THE INVENTION

1. Field of the Invention

The present inventions relate generally to detection of radiation, such as infra-red radiation.

2. Description of Background Art

A photodiode is an electrical component that behaves as a photodetector. Photodiodes are typically implemented as p-n junction diodes that are responsive to optical input, for example, by providing a window, fiber, or other means for photons to impinge on a light-sensitive part of the device.

Many types of photodiodes operate in reverse bias mode. Diodes typically have high impedance when reverse biased, and light of a proper frequency can generate charge carriers to move from the valence band into the conduction band, and are detected in the high impedance diode circuit, thereby allowing sensitive measurement of the light.

FIG. 1A depicts an energy band diagram of a basic p-n junction photodiode. In this diagram, electron energy is plotted vertically, while spatial distance is plotted horizontally. The diagram includes conduction band 102, valence band 104, and Fermi energy level 106. The distance between valence band 104 and conduction band 102 is called the energy gap, or bandgap, 108. In this example, p-type semiconductor 110 is on the right, while n-type semiconductor 112 is on the left. Junction region or depletion region 114 is shown near where the p-type region 110 and the n-type region 112 meet. An electric field E 116 exists in this region. The field 116 exerts a force on charge carriers, moving holes to the right and electrons to the left. This field is a result of the exposed charge in the depletion region, where mobile carriers are depleted by action of the field.

FIG. 1B shows a p-n junction photodiode under reverse bias, a typical operating condition. As in FIG. 1A, the electric field 116 is a result of the formation of a junction or depletion region between 114 the two sides. If a photon 118 with energy greater than bandgap energy 108 strikes regions 110, 112, or 114, electron and hole pairs may be generated by absorption of the photon, which excites an electron from the valence band 104 to the conduction band 102. In typical p-n junction photodiodes, region 114 with electric field 116 is considered the photon absorption region of the photodiode, together with those parts of regions 112 and 110 within a minority carrier diffusion length of region 114. The two outer regions 112, 110, are considered contact regions for collecting photogenerated carriers. Depletion region 114 combined with minority carrier diffusion length regions of 112 and 110 constitute the photon absorption region.

Because the same material is used throughout the device in this example, the bandgap has a constant value across the junction. Such a junction is known as a homojunction, because the junction between semiconductors differs only in doping levels, and not in alloy or atomic composition.

FIG. 1C shows a similar p-n junction diode, this one comprising a heterojunction wherein the bandgap between p-type and n-type regions do not match. In this example, the valence bands 104 of the two halves match, but the conduction bands 102 show a discontinuity 120 where the different bandgap materials meet. The bandgap 108A of the p-type region 110 is smaller than the bandgap 108B of the n-type region 112. The discontinuity 120, in this example, provides a potential barrier against minority carrier flow from the p-type region to the n-type region, even under reverse bias. In this Figure the band-bending is explicitly shown, unlike in the band diagrams of FIGS. 1A and 1B, and hence the valence and conduction band levels are slightly curved at transition points.

Photodiodes, like other electrical devices, experience noise on the current signal. Noise in a photodetector can arise from a combination of sources, including Auger, Shockley-Read-Hall, radiative recombination, and background photon flux. When a photodetector has no light input, the output of the photodetector is called dark current, which consists mainly of diffusion currents from either side of the junction, depletion current from S-R centers in the depletion region of the diode, and some contribution from tunneling currents. For temperatures such that $n_{maj} > n_i$, (where $n_{maj}$ is the majority dopant concentration on either side of the junction, and $n_i$ is the intrinsic carrier concentration) the overall dark current of a well-made diode is dominated by the S-R centers in the depletion region of the diode.

One driving requirement in photodetectors is to reduce dark current. The ideal photodetector cell should produce an electrical signal which increases with increased illumination, but which drops to zero when there is no illumination. This is not normally possible in practice. Dark current not only provides a background "noise" signal which makes images less understandable, but also increases the power consumption of the device.

One of the causes of dark current is the aforementioned Shockley-Read-Hall (S-R) current from generation/recombination centers in the semiconductor's crystal lattice. Any discontinuity or foreign atom in the crystal lattice can provide a location where carrier pairs (electron+hole) can be generated. These S-R centers generate diffusion currents in the electric field-free regions of the diode as well as depletion generation-recombination (g-r) current in the diode depletion region.

Another source is Auger generation. A "hot" carrier (electron or hole) is one which has more energy than the minimum for its band. In p-type material, if a "hot" hole has more than a bandgap's worth of excess energy, it can share its excess energy to promote a valence electron to the conduction band. This electron is a minority carrier in p-type material, and will be a component of dark current. In n-type material, if a hot electron has more than a bandgap's worth of excess energy, it can share its excess energy to similarly generate a mobile hole, which as a minority carrier can contribute to dark current. (This is a very brief summary of the "Auger7" and "Auger1" processes, which are extensively described in the technical literature.) An important difference between these processes is that the time constant for the Auger7 process (in p-type material) in materials systems with a direct energy gap at k=0 is roughly 10-50 times longer than the time constant for the Auger1 process (in n-type material). Thus the Auger component of dark current is much less important in p-type material, if other factors are comparable.

Reduction in dark current is highly desirable. One way to exploit a reduction in dark current is to reduce cooling requirements: infrared imagers are often cooled below room temperature, e.g. with a thermoelectric cooler ("cold finger"), or even with cryogenic refrigeration systems. However, such cooling requirements—especially if cooling much below 0 C is required—add greatly to system cost, bulk, power consumption, and complexity.

Dark current can be particularly problematic for infrared detectors, since the bandgaps of the absorbing material in such detectors are relatively small, in order to permit excitation of carriers into the conduction band by absorbing infrared wavelength photons (which are of relatively low energy).

At very low temperatures, even the shallowest acceptor dopants (which ionize completely at room temperature) may not be completely ionized. For example, if arsenic is used as the acceptor dopant in HgCdTe, then at 25K only about one tenth of the arsenic atoms will be ionized. That is, instead of an As– ion on a tellurium lattice site (and a corresponding mobile hole), the semiconductor lattice merely contains an unionized arsenic atom on the tellurium site. This is true even if the dopant atoms have been fully activated, i.e. are located on the correct lattice sites and also are not interstitials.

Two-Color Separate Absorption and Detection Diode

The present innovations include a detector system, preferably for two colors or wavelengths of infra-red electromagnetic radiation, embodied in a diode architecture. In one example embodiment, the present innovations are described as a separate absorption and detection diode, such that photons absorbed in one region of a diode structure (e.g., a P region) are detected in another region of the diode structure (e.g., an N region). In an example embodiment, the diode is a heterostructure device including a P region which is heavily doped with respect to an adjacent N region, such that the depletion region is substantially confined to the N region of the device. An N+ region is preferably located adjacent to the N region. In preferred embodiments, the N and N+ regions have wide bandgaps relative to the P region. Further, the innovative diode structure preferably includes a graded composition in the N region near the P region such that the resulting field associated with the graded bandgap can be overcome by a modest reverse bias voltage applied to the diode.

In one example embodiment, the present innovations include a diode wherein two different regions have two different bandgaps such that they require different minimum photon energies to excite minority carriers into the valence and conduction bands. In this example, a secondary color (detected in, for example, a wider bandgap region) will be detected at essentially zero bias across the diode, and a primary color (detected in, for example, a narrower bandgap region) will not register in the diode output circuit due to the interfacial barrier to minority carrier electrons that exists between heterojunction regions of the SAD architecture. In this example, the primary color signal is read out by the application of a modest to high reverse bias to the diode. This bias is sufficient to overcome the interfacial barrier, resulting in both colors being read out in the output circuit of the SAD diode. The primary color is preferably obtained by differencing the output signals of the SAD diode at low and high reverse biases, though other means of distinguishing the signals can also be implemented within the context of the present innovations.

The disclosed innovations, in various embodiments, provide one or more of at least the following advantages:
  wide bandgap nature (of, e.g., the N region) enables a significant reduction in dark current;
  graded composition permits conduction band carriers to move from absorption region to a detection region;
  wide bandgap nature enables elimination of tunnel currents;
  p-type nature of absorption region (in preferred embodiments) enables significant reduction in dark current;
  wide bandgap nature of diode depletion region enables significant reduction in dark current;
  gradient of composition bandgap in transition region is large enough to eliminate dark current component from the transition region;
  barrier to minority carrierflow that exists at low applied bias enables separation of two colors in readout circuit;
  the diode is always in reverse bias, thus avoiding any possibility of IR emission from forward biased regions.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1A, 1B, and 1C show energy band diagrams for p-n junction photodiodes.

FIG. 2A shows a diagram of a device consistent with implementing a preferred embodiment of the present innovations.

FIG. 2B shows an energy band diagram for a device consistent with implementing a preferred embodiment of the present innovations.

DETAILED DESCRIPTION OF THE PREFERRED EMBODIMENTS

Figure 1A:
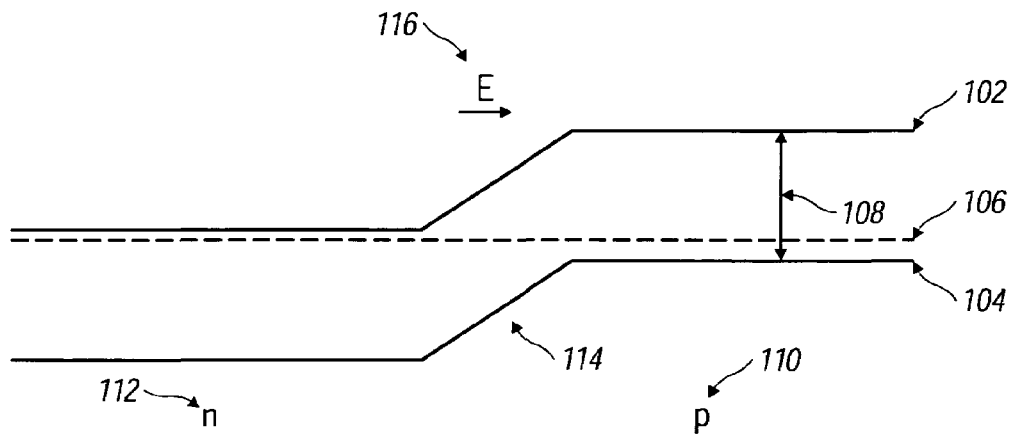
Figure 1B:
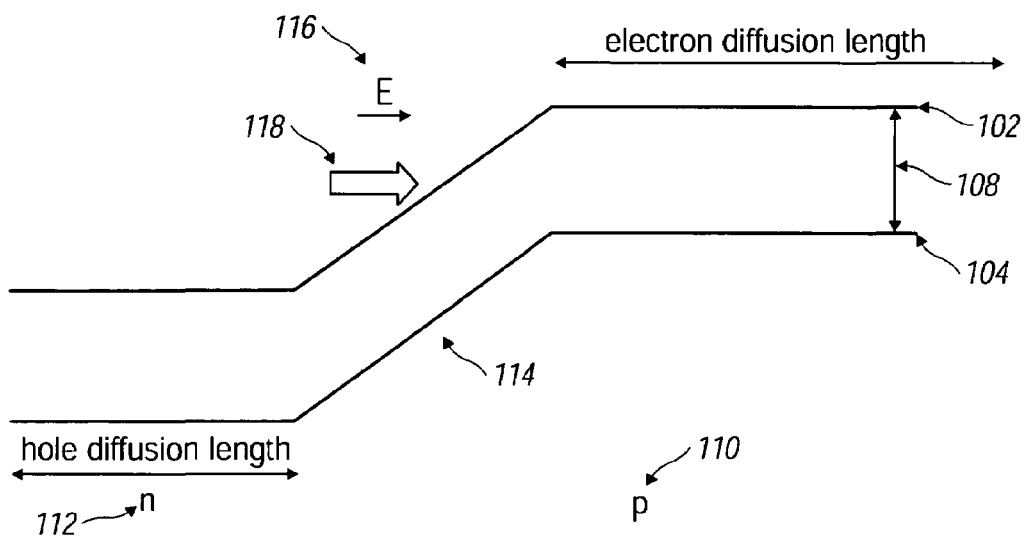

The numerous innovative teachings of the present application will be described with particular reference to the presently preferred embodiment (by way of example, and not of limitation).

In one example embodiment, the present innovations include a separate absorption and detection (SAD) diode, having an architecture with a p-type infrared (IR) semiconductor absorbing region coupled to an adjacent n-type region of generally higher bandgap than the absorber region. In preferred embodiments, the p-type region is heavily doped relative to the n-region such that the depletion region of the diode is substantially confined (preferably entirely confined) to the n-type, higher bandgap region of the device. For temperatures such that $N_{maj} > n_i$, where $n_i$ is the intrinsic carrier concentration of the absorbing p-type region, the overall dark current of a homojunction diode is dominated by generation through S-R centers in the depletion region of the diode. Thus, the wide bandgap nature of, for example, the n-region (or at least partially graded transition region) of the innovative SAD diode (depending on the implementation) will enable a significant reduction in the dark current of the SAD diode, relative to the corresponding homojunction diode. The bandgap is chosen in the n-region to be large enough that the dark current is limited by thermal generation from the field-free p-type absorbing volume, described more fully below.

Diode dark current is due to minority carrier electrons from the p-type region (depending of course on implementation—see, e.g., the example of FIGS. 2A/2B, discussed below) plus minority carrier holes from the n-type region. These flows of minority carriers manifest themselves as current in the output circuit of the diode. In one example, the present innovations minimize minority carrier hole flow, leaving the electron minority carrier flow to dominate.

FIGS. 2A and 2B depict one example consistent with the present innovations. FIG. 2A shows a simplified device structure, and FIG. 2B shows a corresponding energy band diagram. In FIG. 2A, the device 200 is shown in side view. N+ region 202 is layered atop a relatively lightly doped N region 204, which is itself located atop a highly doped P region 206. N+ region 202 and N region 204 both have wide bandgaps relative to the P region 206. In preferred embodiments, the present innovations are embodied using a heterojunction, which provides differing bandgaps between the various regions where the composition differs. The N+ region 202 has a contact 208 by which voltage is applied to the device relative to the p contact 214. In preferred embodiments, the heterojunction device is operated in reverse bias.

The interface between N region 204 and P region 206 by definition contains band discontinuities. In the case of HgCdTe of different compositions on either side of the interface, the larger discontinuity occurs in the conduction band. This potentially abrupt discontinuity, or barrier to minority carrier flow from the P region, is preferably softened by a degree of compositional grading (e.g., in region 204A) such that the resulting field associated with the graded bandgap can be overcome by a modest reverse bias voltage V applied to the diode, as depicted in FIG. 2B. In this manner, photo-generated electrons in the P region absorber can migrate from the P region into the N region (or another region left of the P region, as shown in the diagram) of the SAD diode for detection. Graded region 204A can vary in size, but is preferably limited to the N region (in this example).

FIG. 2B shows one example energy band diagram consistent with the innovative structure shown in FIG. 2A. In this example, P region 206 is adjacent to N region 204, followed by N+ region 202. P region 206 acts as the photon absorbing region, where light (preferably of IR wavelength) is incident. The incident photons have enough energy to cause electrons to enter the conduction band. This of course depends on the bandgap of the P region, which is selected depending on the wavelength of radiation the device is designed to detect. When photons of the proper energy strike the P region 206, the excited electrons move toward the depletion region from within an electron diffusion length of the junction, preferably located substantially (or more preferably, completely) in the N region 204. N region 204 preferably includes a region of compositional grading 204A which softens the slope of the discontinuity of the conduction band threshold between the P and N regions.

In this example, the solid line 210 depicts the bandgap under zero bias, and the dashed line 212 depicts the bandgap under reverse bias. As shown, barrier region 204A still offers a barrier to minority carriers from the P region 206 when the device is under zero bias. However, when the device is under reverse bias, the barrier is preferably entirely flattened, allowing the carriers excited by the photons to move from the P region 206 into the N region 204, and then to continue that movement as determined by the electric fields of the device. For example, an electrode contacted to material in the N region 204 or the N+ region 202 could measure the current through the device to thereby detect photons of a proper wavelength striking the P region 206.

The following paragraphs describe example implementations consistent with preferred embodiments of the present innovations. None of the stated requirements are intended to limit the scope of the present innovations, but are only intended to serve as an example of how the present innovations can be implemented.

The separate absorption and detection (SAD) diode is a diode architecture consisting of a p-type infrared (IR) semiconductor absorbing region coupled to an adjacent n-type diode region of higher bandgap than the absorber. The p-region is heavily doped relative to the n-region such that the depletion region of the diode is confined entirely to the n-type higher bandgap region of the device. For temperatures such that $n_a > n_i$, where $n_i$ is the intrinsic carrier concentration of the absorbing p-region, the overall dark current of a well-made diode is dominated by generation through Shockley-Read (S-R) centers in the depletion region of the diode. Thus, the wide bandgap nature of the n-region will enable a significant reduction in the limiting dark current of the SAD diode. The bandgap of the n-region is simply chosen to be large enough that the dark current of the diode is limited by thermal generation from the field-free p-type absorbing volume. The diode architecture and band diagram are shown in FIG. 2. The underlines of the N+ and N regions in FIG. 2(a) indicate that these regions are wide bandgap relative to the P region. The interface between the N and P regions by definition contains band discontinuities. In the case of HgCdTe of different compositions on either side of the interface the larger discontinuity occurs in the conduction band. This potentially abrupt discontinuity, or barrier to minority carrier flow from the P region, needs to be softened by a degree of compositional grading such that the resulting field associated with the graded bandgap can be overcome by a modest reverse bias voltage V applied to the diode, as indicated in FIG. 2(b). In this manner photo-generated electrons in the P region absorber can be detected by the N region of the SAD diode.

Figure 3:
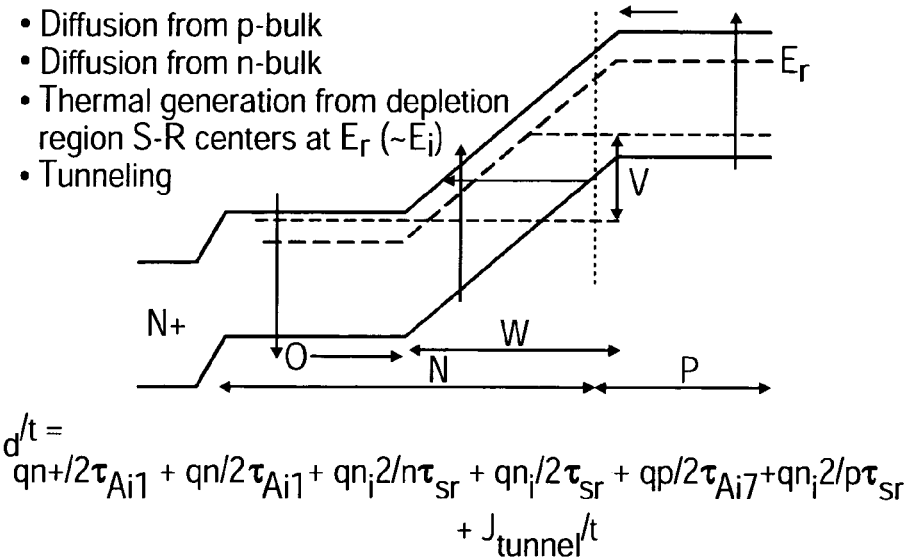
FIG. 3 shows a diagram depicting various contributions to currents in a semiconductor device.

The primary benefit of the SAD diode lies in the reduction of thermally generated dark current in the device relative to the standard IR absorbing homojunction, or the conventional double layer heterojunction (DLHJ), which is wide bandgap P+ on N, where N is the absorber. The primary dark current components per unit volume in a well-made one-sided HgCdTe homojunction photodiode are as shown in FIG. 3, and consist of diffusion currents from either side of the junction, together with thermal generation through S-R centers in the depletion region of the diode. Tunneling currents can also play a role but normally just serve to limit the doping concentration and bias voltage that can be utilized in the depletion region.

Figure 4:
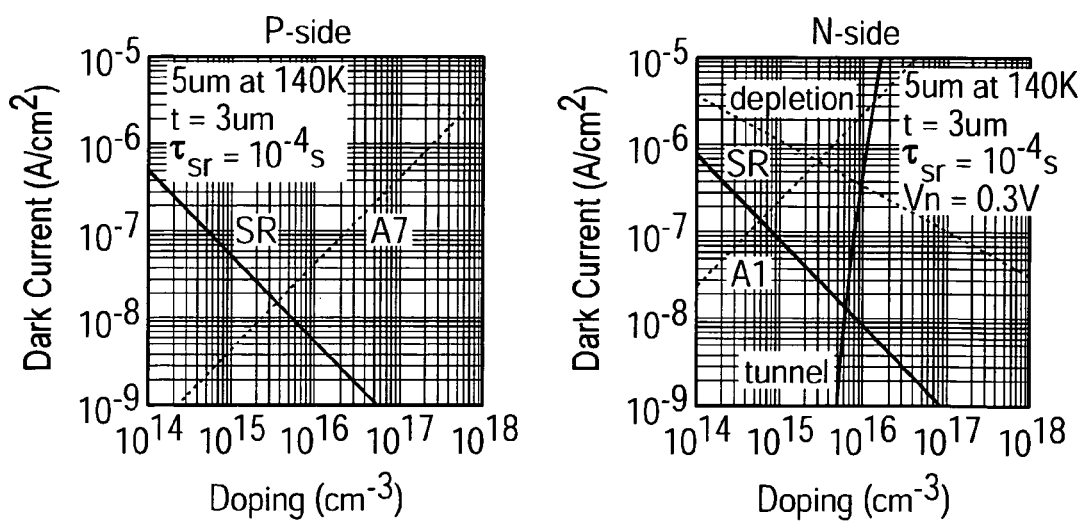
FIG. 4 shows dark current components for a device where only the doping concentrations vary across the junction and material composition (and bandgaps) do not vary.

The diffusion current has two components associated with Auger and Shockley-Read (S-R) generation. On the N-side, in the non-equilibrium environment of a reverse-biased diode, the Auger1 component is $qn/2\tau_{Ai1}$, and the S-R component $qn_i^2/n\tau_{SRn}$, where $\tau_{Ai1}$ is the Auger1 lifetime, n the donor concentration, and $\tau_{SRn}$ the S-R lifetime of minority carrier holes in N-side material. Likewise for the P-side, the Auger7 component is $qp/2\tau_{Ai7}$, and the S-R component $qn_i^2/p\tau_{SRp}$. In material with a density of S-R centers that is lower than any relevant doping concentration, $\tau_{SRn}=\tau_{po}[(n+n_i)/n]+\tau_{no}n_i/n$, and $\tau_{SRp}=\tau_{no}[(p+n_i)/p]+\tau_{po}n_i/p$, where $\tau_{no}=1/\gamma_n N_r$, and $\tau_{po}=1/\gamma_p N_r$. $\gamma_n$ and $\gamma_p$ are the recombination coefficients for electrons and holes into the $N_r$ neutral centers located at the intrinsic energy level in the bandgap of the semiconductor. For neutral centers at the intrinsic energy level $\tau_{no} \sim \tau_{po} \sim \tau$. Thus the S-R diffusion current is given by, on the N-side $qn_i^2/(n+2n_i)\tau$, and the P-side by $qn_i^2/(p+2n_i)\tau$. Thus for temperatures at which n, p>$n_i$ then the S-R diffusion current varies as 1/n, or 1/p. The Auger components on the other hand vary as n, or p. Thus on each side of the junction the diffusion current will minimize at a doping concentration that equalizes the two diffusion components due to Auger and S-R. In the one-sided junction of FIG. 3 the depletion region is devoid of majority carriers and lies entirely on the N-side. The thermal generation rate/unit volume through the S-R centers for this majority carrier free region is $qn_i/2\tau$. The relative magnitudes of these various N- and P-side dark current components are shown in FIG. 4, for a representative case of 5 μm cutoff HgCdTe at 140K. The model assumes a thickness of 3 μm for both N- and P-sides, an S-R lifetime, $\tau=10^{-4}$ s, and an absence of vacancies from the P-volume. Literature values for $\tau_{Ai1}$, and $\tau_{Ai7}$ are assumed with $\tau_{Ai7}=60\tau_{Ai1}$. Tunneling considerations are seen to limit the donor density <$7\times10^{15}$ cm$^{-3}$ for V=0.3V.

The limitations of the homojunction diode are clearly exposed in FIG. 4. The P-side dark current minimizes at ~$3\times10^{-8}$ A/cm$^2$, whereas the N-side is completely dominated by the depletion current component to values ~1 to $3\times10^{-6}$ A/cm$^2$ at usable doping concentrations. This property of the homojunction is unavoidable, as the optimized dark current generation rate per unit volume in the diffusion regions is $qn_i^2/(N_{maj}+2n_i)\tau$, but in the depletion region is $qn_i/2\tau$. For operating temperatures where $N_{maj} \gg n_i$ then the depletion current generation rate per unit volume will always be larger than the diffusion current by the ratio $N_{maj}/n_i$, which can be very large, regardless of the value of the S-R lifetime.

The SAD diode eliminates this dark current limitation of the homojunction (and also the P+/N DLHJ) by increasing the bandgap $E_{g2}$ on the N-side to a value which renders the dark current from the N-side smaller than the optimized dark current from the P-side.

Figure 8:
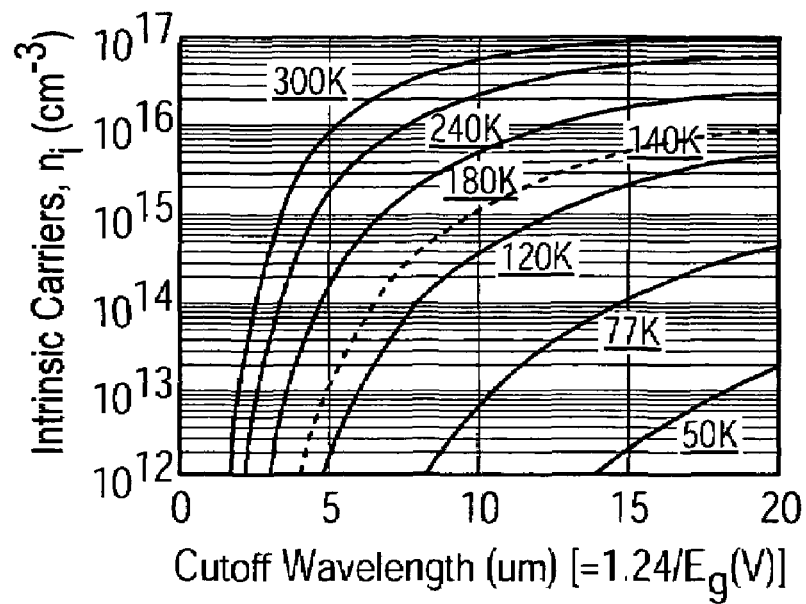
FIG. 8 shows intrinsic carrier concentration and cutoff wavelengths at various operating temperatures for a photodiode.

This aspect of the SAD diode will be true for any absorbing cutoff wavelength for which $n_i$, at the system operating temperature, is much less than the doping concentration in the absorbing P-layer. FIG. 8 shows the dependence of $n_i$ versus cutoff wavelength for a range of operating temperatures of HgCdTe. A realistic doping concentration for the p absorbing region is obtained by optimizing it for approximate equality of the Auger7 and S-R diffusion currents at the specific operating temperature. For reasonable S-R lifetimes in HgCdTe this optimized doping concentration is typically $10^{15}$ to $10^{16}$ cm$^{-3}$. Thus a realistic value of useful operating temperature for any cutoff wavelength can be obtained from FIG. 8 by assuming that $n_i$ needs to be <$10^{14}$ cm$^{-3}$. For example meaningful reductions in dark current for a 10.5 μm SAD diode should be achievable at temperatures <100K, and for a 5 μm SAD diode at temperatures <180K.

Figure 9:
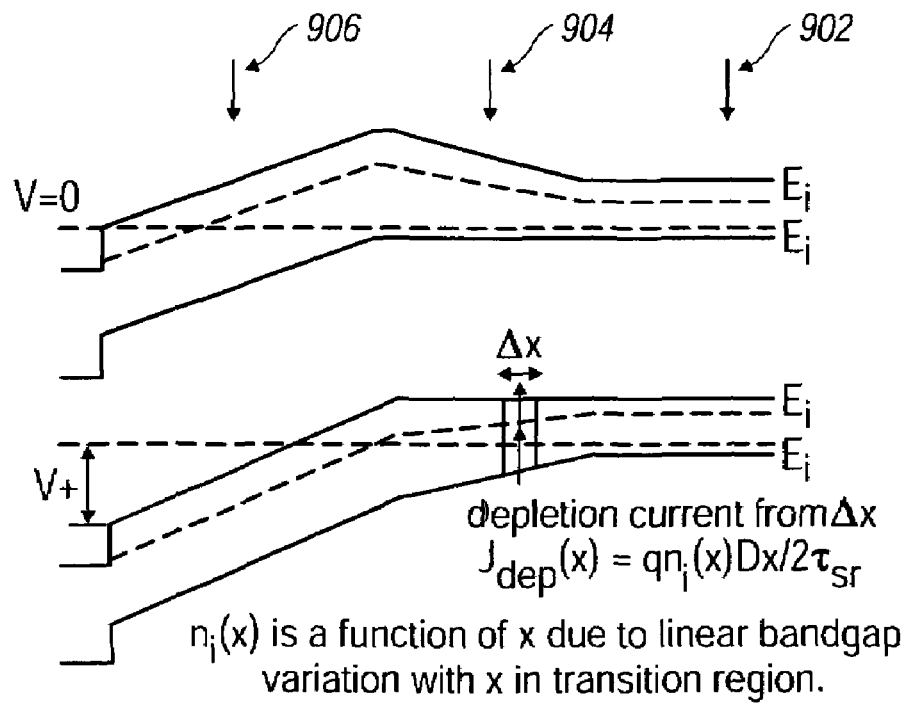
FIG. 9 shows diagrams of bandgaps consistent with preferred embodiments of the present innovations

Similar arguments apply for an N+/P–/P SAD structure as shown in FIG. 9, and it is relevant to consider the dark current generated from the graded bandgap transition region. This is obtained by integrating the depletion current from incremental depletion regions Δx, assuming that the bandgap increases linearly with distance x as you traverse the transition region of width d. If the bandgap increases from $E_{g1}$ to $E_{g2}$ then the transitional bandgap gradient, or effective electric field, is given by $F_t=[E_{g2}-E_{g1}]/d$. The resulting dark current from this transition region is $J_d=[2kT/qF_t]n_i(E_{g1})/2\tau$. It is imperative that this dark current be less than the dark current from the absorbing P region of the SAD diode, which gives a condition on the required value of $F_t$. It is also preferred that the bandgap $E_{g2}$ again be chosen so that the dark current from the wide bandgap region is less than the P absorbing volume.

Figure 10:
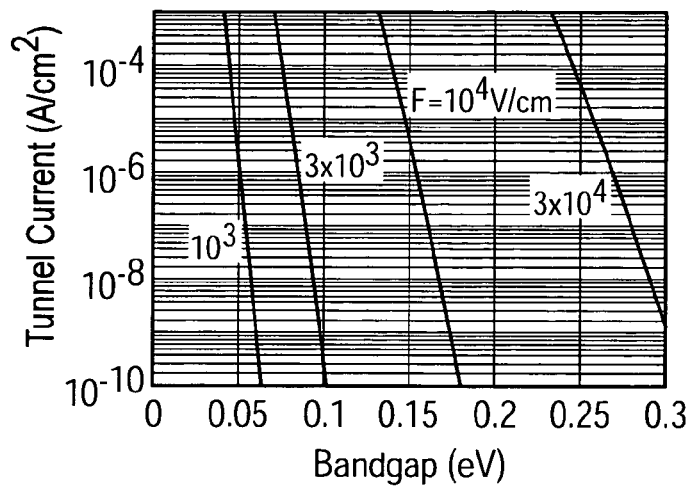
FIG. 10 shows a log plot of tunnel current and bandgap.

There is a limit on $F_t$ in that it needs to be small enough that the electric field required to overcome the minority carrier barrier associated with the transition region does not generate tunnel breakdown in the wide gap region $E_{g2}$. The tunnel breakdown condition in HgCdTe for a diode with a uniform applied electric field F is given by $$J_{tunnel}=26.4FV\exp(-1.062\times10^7 E_g^2/F) \text{A/cm}^2,$$

where F is the applied field in V/cm, V the applied voltage in V, and $E_g$ the bandgap in eV. A uniform electric field is a reasonably good approximation for the low doped region of the SAD diode, assuming a reasonably thin $E_{g2}$ region (~1 to 2 um). The dependence of $J_{tunnel}$ on bandgap for different electric field values is shown in FIG. 10. It is apparent that a field of $10^4$V/cm requires a value of $E_g=0.2$ eV to avoid breakdown.

The sequence for selection of required parameters for the successful operation of a SAD diode follows:

1. Select the desired cutoff wavelength, thus defining $E_{g1}$.
2. The p-type doping of the absorbing region will optimize at $10^{15}$ to $10^{16}$ cm$^{-3}$ for most cutoff wavelengths in state of the art HgCdTe.
3. The doping of the $E_{g2}$ region must be <<p-doping of the absorber, such that a one-sided depletion region is obtained in the SAD diode. A value as low as possible is desired, such as ~$10^{14}$ cm$^{-3}$, which is possible for HgCdTe. Such a value will ensure that none of the applied voltage will generate a depletion region in the $E_{g1}$ absorber region.
4. Choose the operating temperature such that $n_i$<<p-doping, say $n_i$<$10^{14}$ cm$^{-3}$.

5. The requirement on depletion current from the transition region is that it be <diffusion current from the $E_{g1}$ absorber region. If we assume that diffusion current from the absorber is S-R limited then the requirement on $F_t$ is that $[kT/qF_t]qn_i/\tau < qn_i^2 t/p\tau$, which simplifies to $F_t > (kT/q)(p/n_i)/t$, where t is the absorber thickness which will be $\sim 1/\alpha$, where $\alpha$ is the absorption coefficient.
6. The required $F_t$ value determines the applied field (F), which in turn determines the value minimum of $E_{g2}$ for the wide gap detecting region.
7. This value of $E_{g2}$ must also result in a depletion current from the wide gap region that is <diffusion current from the p-absorber, and also does not exhibit tunnel breakdown under an applied field $F > F_t$.
8. The values of $F_t$, $E_{g1}$ and $E_{g2}$ determine the width of the transition region required.
9. The value of $F_t$, together with the thickness of the $E_{g2}$ region, determine the required applied voltage on the SAD diode.

Regarding point 7 above: The difference in bandgaps between the absorber and detector regions should preferably be large enough that the depletion current from the wide gap region be less than the diffusion current from the p-absorber region. Following the discussion above, this implies that $$qn_i(E_{g2})W/(2\tau) < qn_i(E_{g1})^2 t/(p\tau)$$

is the S-R lifetime, W the thickness of the wide where $\tau$ gap region, and t is the thickness of the absorber. This then implies the condition that $$n_i(E_{g2}) < n_i(E_{g1})^2 [2t/W]/p.$$

For $p \sim 2e15$ cm$^{-3}$ and $[2t/W] \sim 5$, this condition translates into $E_{g2} > 1.7 E_{g1}$, and is true for all meaningful operating temperatures.

This condition holds approximately true as long as you don't have to worry about tunnel current, which becomes a problem for $E_{g2} < 0.1$ eV. This means that you can use the approximate condition that $E_{g2} > 1.7 E_{g1}$, as long as $E_{g2}$ is $>0.1$ eV, i.e. as long as $E_{g1} > 0.059$ eV. For $E_{g1} < 0.059$ eV then we need to make $E_{g2}$ equal to or greater than 0.1 eV.

Two practical requirements that must be borne in mind are that

1. The transition region thickness will be limited by the vapor phase growth technique used to generate the hetero-structure. MBE utilizes a typical growth temperature of ~175 C and as such provides a minimum of inter-diffusion between regions. Transition regions >500 A wide should be possible with this technique. MOCVD growth on the other hand occurs at ~350 C and inter-diffusion is a significant issue. Transition regions <1 to 2000 A may not be possible with this vapor phase technique.

2. The thickness of the $E_{g2}$ region needs to be at least ~2 um to allow for the formation of an n+ region by ion etching or ion implantation. This would result in a diode depletion width of at least ~1 um.

MWIR (5 um cutoff) at 140K (for N+/P−/P SAD Diode Structure)

The following discussion is given in the context of a SAD diode with N+/P−/P structure, though the present innovations are not limited to only that embodiment. Select p doping=5× 10$^{15}$ cm$^3$; p−=10$^{14}$ cm$^{-3}$; t=6 um, thickness of $E_{g2}$ region W=1 um.

From FIG. 8 $n_i \sim 10^{13}$ cm$^{-3}$ so $p/n_i \sim 500$. The requirement on $F_t$ is $>(kT/q)(p/n_i)/t$, so we have $F_t > 10^4$V/cm, which easily satisfies the tunneling criterion established for this field in FIG. 10 which indicates that $E_{g2} > 0.2$ eV. The bandgap $E_{g2}$ is thus determined in this case not by a tunneling requirement but by the dark current consideration that depletion current from $E_{g2}$ < diffusion current from $E_{g1}$. Thus again assuming that $E_{g1}$ is diffusion limited then we require that $qn_i(E_{g2})W/2\tau < qn_i(E_{g1})^2 t/p\tau$, which gives $n_i(E_{g2}) < n_i^2(E_{g1})[t/W]/p$, where W is the width of the $E_{g2}$ region. Again from FIG. 8 we have $n_i(E_{g1})=10^{13}$ cm$^{-3}$, giving a requirement of $n_i(E_{g2}) < 1.2 \times 10^{11}$ cm$^3$, which corresponds to a bandgap $E_{g2}=0.355$ eV. Thus the thickness of the transition region is given by $[E_{g2}-E_{g1}]/F_t=0.105/104=1050$ A.

Similar calculations for LWIR (10 um at 77K) and SWIR (2.5 um at 240K) are included in Table 1. for the SAD N+/P−/P diode, with t=6 um and W=1 um.

TABLE 1

SAD Parameters for Various Absorber Cutoffs

| | p $E_{g1}$ (cm$^{-3}$) | p- $E_{g2}$ (cm$^{-3}$) | $E_{g1}$ (eV) | T (K) | $F_t$ V/cm | $E_{g2}$ (eV) | d (A) | Bias (V) |
|---|---|---|---|---|---|---|---|---|
| MW (5 um) | 5 × 10$^{15}$ | 10$^{14}$ | 0.25 | 140 | 10$^4$ | 0.355 | 1050 | 1.0 |
| LW (10 um) | 5 × 10$^{15}$ | 10$^{14}$ | 0.124 | 77 | 7.7 × 10$^3$ | 0.191 | 870 | 0.77 |
| SW (2.5 um) | 10$^{16}$ | 10$^{14}$ | 0.496 | 300 | 4.2 × 10$^3$ | 0.653 | 3738 | 0.42 |

Similar arguments apply for the N+/N−/P SAD diode concept, as well as other embodiments of the present innovations.

The present innovations can be embodied in a number of structures, with variations in the doping and materials used, operating conditions, thicknesses, and other parameters. Examples presented herein are only intended to be illustrative, and do not imply limitations to the innovative concepts as presented. Some further example implementations are presented below.

Though the present innovations are useful in a wide array of implementations and situations, preferred embodiments use these innovations in the context of an array of IR detector cells.

Figure 5A:
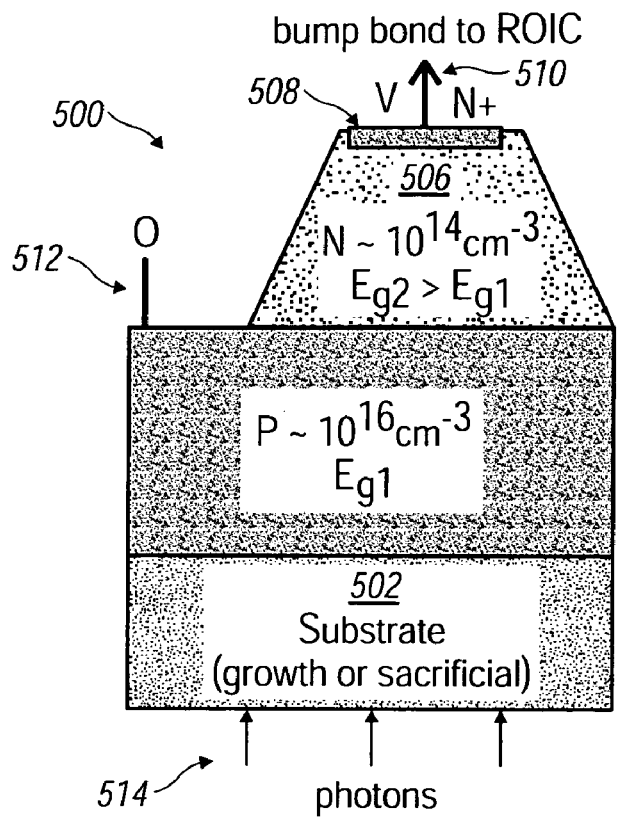
FIG. 5A shows a diagram of a device consistent with implementing a preferred embodiment of the present innovations.
Figure 5B:
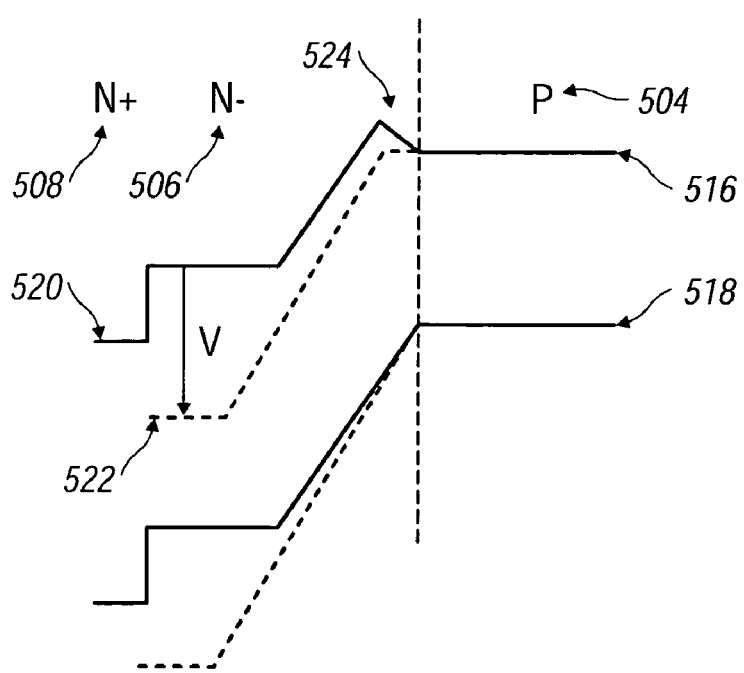
FIG. 5B shows an energy band diagram for a device consistent with implementing a preferred embodiment of the present innovations.

One example implementation is depicted in FIGS. 5A and 5B. FIG. 5A shows a side view of a photodiode consistent with implementing an embodiment of the present innovations, while FIG. 5B shows an energy band diagram corresponding to that architecture.

FIG. 5A shows a back-side illuminated unit cell of a photodiode 500 with a mesa N+/N−/P architecture, preferably using the material HgCdTe of varying constituencies (described more fully below) in a heterostructure operated at non-equilibrium, in reverse-bias. In this example, photons 514 strike a backside surface (substrate 502) of diode 500. P region 504 is fabricated atop substrate 502. P region, in this example, preferably serves as the absorbing region, where photons 514 excite carriers (preferably minority carriers) into the conduction band 516 (see FIG. 5B). N region 506 is formed atop P region 504. In preferred embodiments, P region 504 is heavily doped relative to N region 506 such that the depletion region of the interface is confined substantially (preferably entirely) to N region 506. In this example, P region 504 has energy bandgap of $E_{g1}$, and a doping concentration of $10^{16}$ cm$^{-3}$. N region 506 has bandgap $E_{g2}$ and doping concentration of $10^{14}$ cm$^{-3}$. In preferred embodiments, $E_{g2} > E_{g1}$. In HgCdTe systems, there is a conduction band discontinuity between the P and N regions. In preferred embodiments of the present innovations, this discontinuity is softened by compositional grading of the HgCdTe constituencies, forming a sloped discontinuity 524 in N region 506 adjacent to P region 504. Under zero bias 520, the discontinuity presents a barrier to minority carrier flow from P region 504 into N region 506. However, under reverse bias 522, the barrier 524 is reduced or disappears entirely, allowing minority carrier flow.

Atop N region 506 is formed a more heavily doped N+ region 508 that allows majority carrier contact to the device, where voltage 510 is applied. In this example, ground 512 is also contacted to P region 504. The device is preferably operated in reverse bias, so that when photons 514 impinge on the device, they excite minority carriers of P region 504 into conduction band 516, which can move toward N regions 506, 508 where they can be detected. This detection is preferably indicated by a change in current of the device. Device 500 is, in one example embodiment, bump bonded to a read-out integrated circuit (ROIC), which contains circuit elements useful in receiving output of the diode 500 to serve as a photon detector. Detection of the photons can occur, in one preferred embodiment, as a detection of minority carrier current flowing through the diode into an output preamp. This current can then be integrated on a capacitor for a finite time and measured. Other ways of measuring the output can also be used.

Figure 6A:
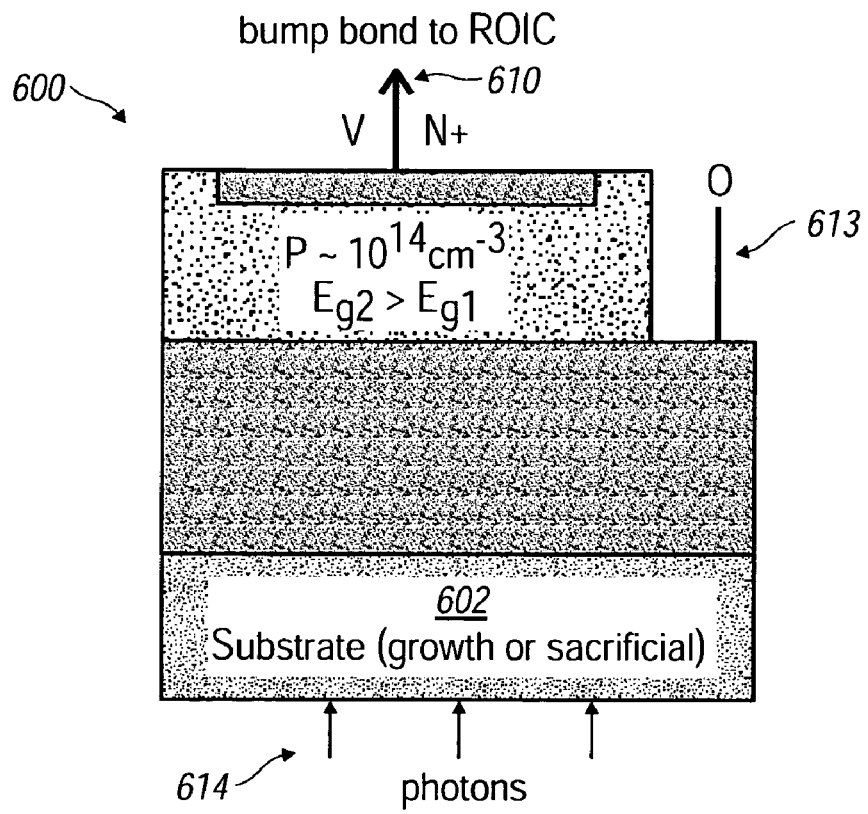
FIG. 6A shows a diagram of a device consistent with implementing a preferred embodiment of the present innovations.
Figure 6B:
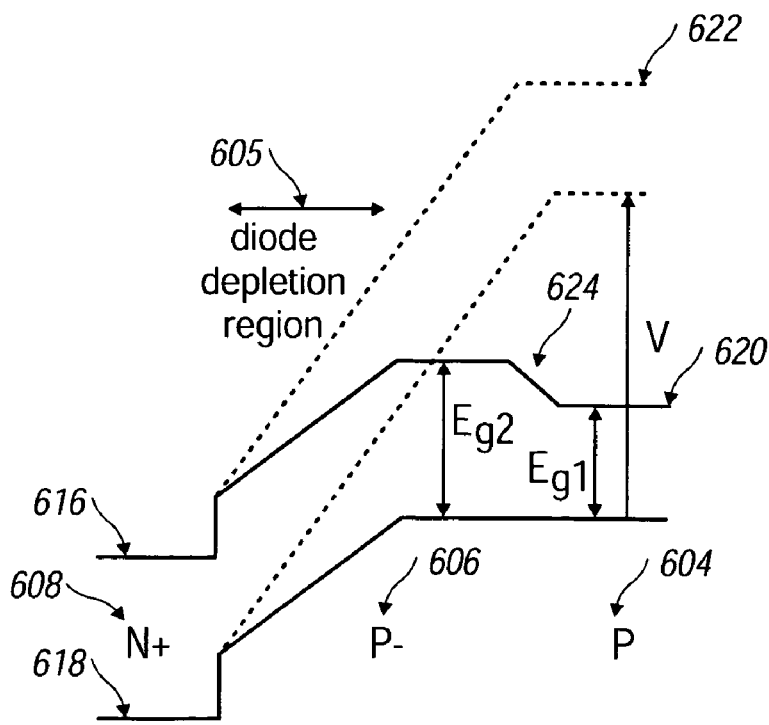
FIG. 6B shows an energy band diagram for a device consistent with implementing a preferred embodiment of the present innovations.

FIGS. 6A and 6B show another example implementation consistent with the present innovations. This is another example of a backside illuminated device 600, where photons 614 are received at a substrate 602. The substrate has formed thereon a P region 604, which is followed by a P– region 606 and an N+ region 608 that forms a diode region in 606 and serves to apply voltage 610 to the device. The diode has a depletion region 605 as shown. P region 604 is also grounded 612 in this example. P region 604 is preferably heavily doped relative to P– region 606, whereas P– region 606 has a wide bandgap relative to P region 604. In this example, P region 604 has doping of $10^{16}$ cm$^{-3}$, while P– region 606 has doping of $10^{14}$ cm$^{-3}$.

FIG. 6B shows the energy diagram for this example structure, including valence band 618 and conduction band 616. In this example, when under zero bias 620, the device shows a barrier 624 in conduction band 616 to minority carriers from P region 604 to P– region 606. However, when the device is put under reverse bias 622 the barrier 624 disappears, which allows carriers from P region 604 to move into P– region 606 and N+ region 608 where they can be detected, as described above. Barrier 624 is best implemented using compositional grading of a HgCdTe material, in preferred embodiments.

One advantage to the P/P–/N+ diode architecture is that a planar structure can be made which has advantages over mesas due to passivation issues.

Figure 7A:
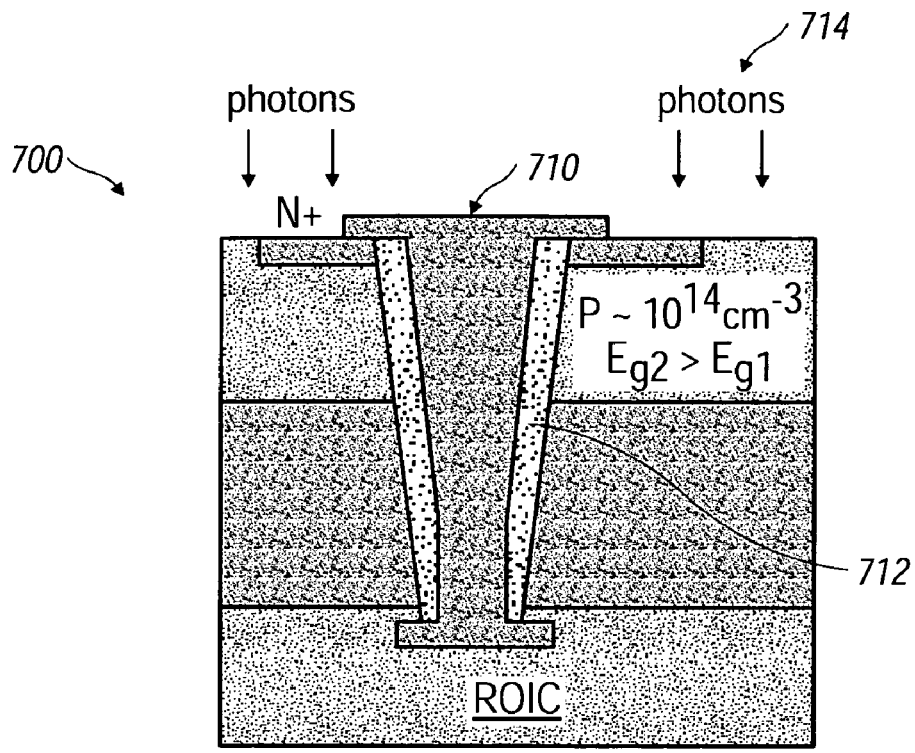
FIG. 7A shows a diagram of a device consistent with implementing a preferred embodiment of the present innovations.
Figure 7B:
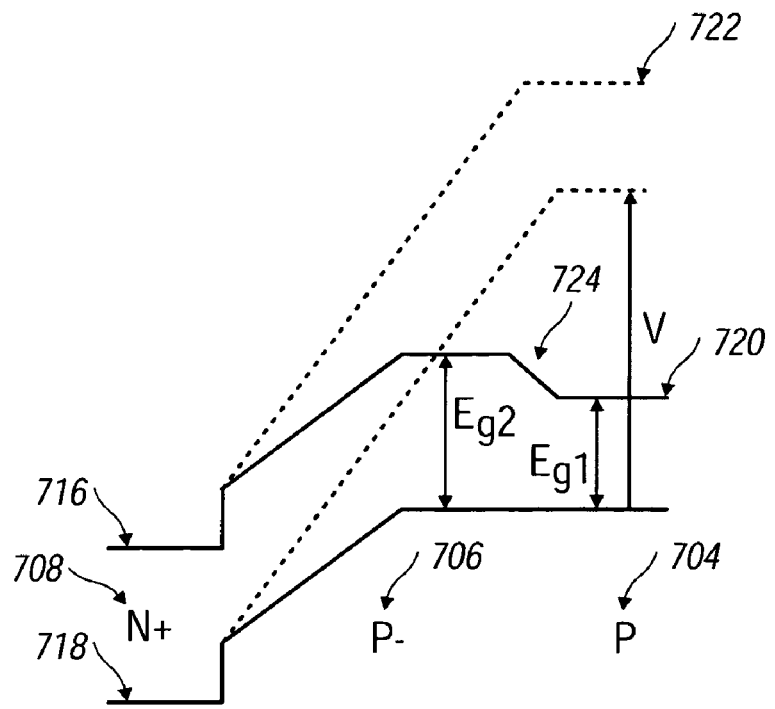
FIG. 7B shows an energy band diagram for a device consistent with implementing a preferred embodiment of the present innovations.

FIGS. 7A and 7B show another embodiment of the present innovations, including structure (FIG. 7A) and energy diagram (FIG. 7B). The device 700 includes ROIC 702 which is contacted by contact metal 710, which itself is fabricated through various layers, including P region 704, P– region 706, and N+ region 708. Similar to some previously described embodiments, P region 704 is preferably doped such that the depletion region occurs substantially (preferably entirely) in P– region 706, which has a larger bandgap than P region 704. Photons 714 occur at the top of the device, and interact with P– region 706 and P region 704. Contact metal 710 is preferably isolated electrically from P and P– regions by insulator 712. Contact metal 710 can be formed, for example, as a via. P region 704 can be grounded remotely (not shown in figure).

FIG. 7B shows the effect of reverse bias on the device. At zero bias 720, barrier 724 resists minority carrier flow from P region 704 to P– region 706. However, under reverse bias 722, barrier 724 is reduced or eliminated, allowing carrier flow out of P region 704.

FIG. 8 shows a graph of intrinsic carrier concentration v. HgCdTe cutoff wavelengths at various temperatures. Embodiments of the present innovations, such as the SAD diode of FIG. 5 (for example), will reduce dark current relative to a homojunction diode if the net doping concentration, $N_a$, in the p-type absorbing layer is much greater than the intrinsic carrier concentration $n_i$ at the chosen operating temperature. Thus, for $N_a = 5 \times 10^{15}$ cm$^{-3}$ at 180K reduced dark current would be obtained for HgCdTe cutoff wavelengths less than 7 microns (assuming that $N_a > 5 n_i$). At 300K, cutoff wavelengths need to be less than 3.5 microns. Thus, as we increase operating temperature, the advantage of the SAD diode is primarily seen at the shorter cutoff wavelengths.

FIG. 9 shows diagrams of bandgaps consistent with preferred embodiments of the present innovations, including the top diagram for zero applied voltage and the bottom which shows the system under reverse bias. In this example, region 902 is, for example, a heavily doped P region, regions 904 and 906 are P– region, and region 904 is the depletion region, preferably located entirely in the P– region 906. In the lower diagram, showing the reverse bias case, the potential barrier is flat, allowing minority carrier flow from P region 902 to N region 906 where detection can occur. This diagram also shows contribution to dark current from the depletion region. The intrinsic carrier concentration is a function of horizontal position (x) due to linear bandgap variation with x in the transition region. As shown in the figure, the depletion current from a region $\Delta x$ is $J_{dep}(x) = q n_i(x) \Delta x / 2 \tau_{sr}$.

FIG. 10 shows a log plot of tunnel current and bandgap. The bandgap of the absorbing material must of course be of a size such that photons of the proper energy can excite carriers across the bandgap. The plot of FIG. 10 shows different bandgap plots and tunnel currents for different applied electric fields. These values can be used to determine constraints on the device. For example, if it is determined that a tunnel current of less than $10^{-9}$ A/cm$^2$ is desirable, and if the photons to be detected require a bandgap no larger than 0.1 eV, then the applied electric field is constrained (in this example) to somewhere near $3 \times 10^3$ V/cm.

Figure 11:
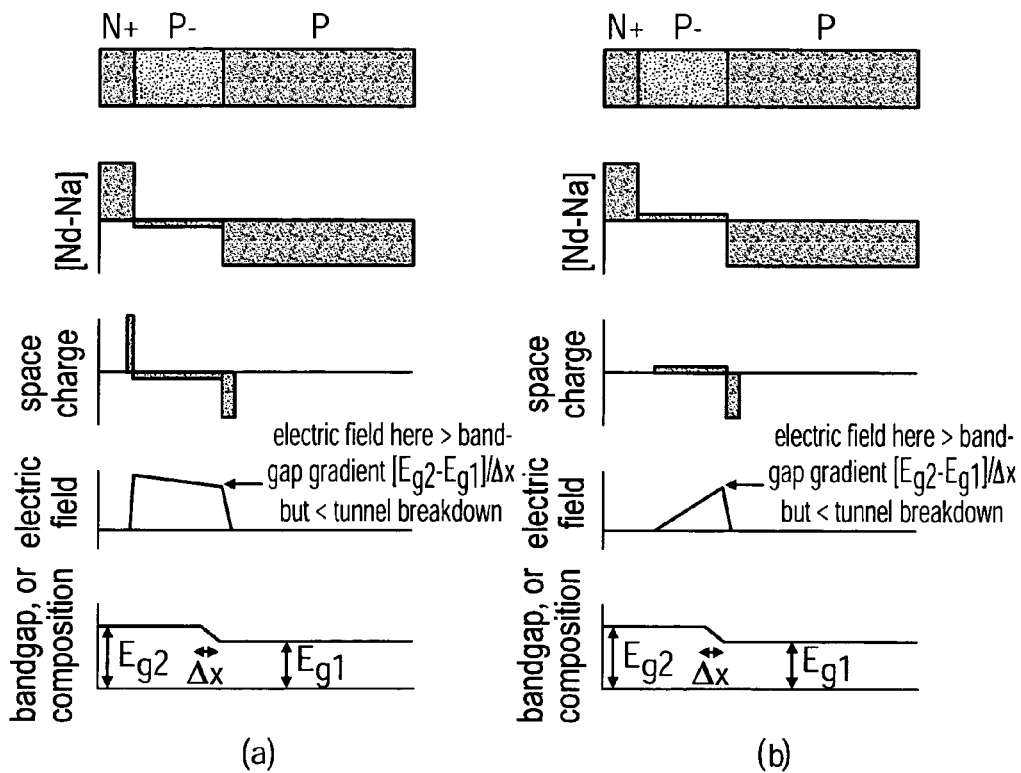
FIG. 11 shows various profiles for two different embodiments of the present innovations.

FIG. 11 shows profiles of doping, charge, and electric field for two different embodiments of the present innovations.

Separate Absorption and Detection (SAD) Diode for 2-Color Operation

The SAD diode described above can also be operated as a single contact sequential (or pseudo-simultaneous) 2-color detector by using different layers of the device (which preferably have different bandgaps) as detectors for different colors of light or wavelengths of radiation, preferably IR radiation. For example, in one embodiment (using an N+/N/P structure similar to that shown in FIG. 2) a two-color detector is achieved by using the wider bandgap N-region 204 as a detector of the secondary color, and the P-side 206 absorber as a detector of the primary color. The bandgaps of the two absorbing regions of this embodiment should be chosen according to the particular wavelengths that are to be detected, such that the incident photons have enough energy to generate minority carriers to the conduction and valence bands (across the bandgap) for that particular region. Thus, in this example, since the N region 204 has a wider bandgap than P region 206, the N region would be used to detect photons of higher energy, while the P region would be used to detect photons of a lower energy, where the photons of the higher energy are referred to as the secondary color and the lower energy photons are referred to as the primary color.

In this example, the secondary color will be detected at essentially zero bias across the SAD diode, and the primary color detected by the P-type absorber will not register in the diode output circuit due to the interfacial barrier 204A to minority carrier electrons that exists between the heterojunction regions of the SAD architecture. The P-side signal is read out by the application of a modest to high reverse bias to the SAD diode as shown in FIG. 2. This bias is sufficient to overcome the interfacial barrier, resulting in both colors being read out in the output circuit of the SAD diode. The primary color is preferably obtained by differencing the output signals of the SAD diode at low and high reverse biases, though other means of distinguishing the signals can also be implemented within the context of the present innovations.

Figure 12:
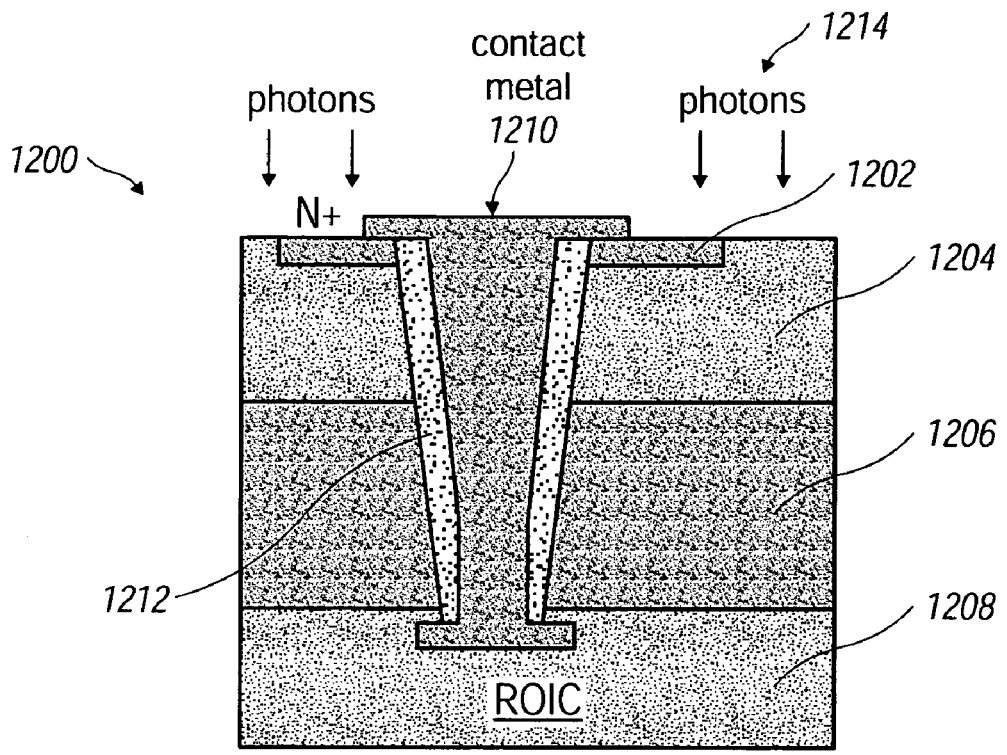
FIG. 12 shows a photodiode capable of detecting two different wavelengths consistent with a preferred embodiment of the present innovations.

FIG. 12 shows an example diode architecture 1200 consistent with a preferred embodiment of the present innovations. This example device includes N+ region 1202, P− region 1204, and P region 1206 attached to ROIC 1208. Contact 1212 is made at the top of the device and connects to ROIC 1208 through a via or trench through the N+, P−, and P layers. Contact 1210 is separated from the layers of the diode by insulator 1212 shown on both sides of this cut-away view.

Photons 1214 are preferably incident on the device such that they reach P− region 1204 before reaching P region 1206. In this example, P− region 1204 has a bandgap which is larger than that of P region 1206. This means, in this example, that P− region 1204 is the secondary color detector, while P region 1206 is the primary color detector.

This example is depicted as a high density vertically integrated photodiode (HDVIP), and the top-side contact 1210 to the P− region 1204 can be made in the standard HDVIP manner. The N+ region 1202 is generated, for example, by a suitable ion implant. This architecture is suitable as a single unit cell configuration for an array of detectors. A backside contact (not shown) can be implemented, for example, around the periphery of the focal plane array, or can be included within the unit cell, and is preferably P+ in nature. If within the unit cell it is preferably small in volume or of a wider bandgap than the absorbing region of the photodiode. It can also be implemented remote to the unit cell.

Figure 13:
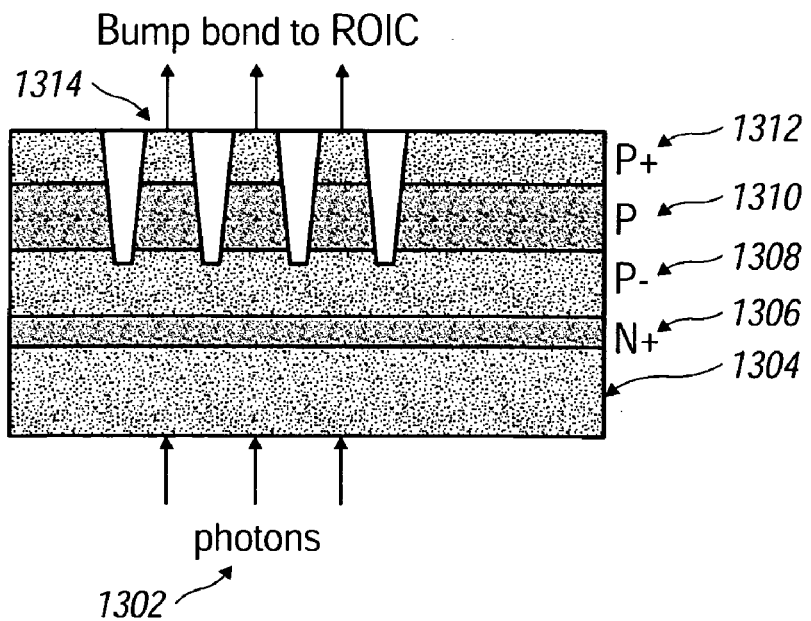
FIG. 13 shows an array of photodiodes consistent with preferred embodiments of the present innovations.

FIG. 13 shows another example embodiment for the bump-bonded version of the two-color concept. In this example, photons 1302 are incident on a growth substrate 1304 which has layered atop it an N+ region 1306, a P− region 1308 (with bandgap $E_{g2}$), a P region 1310 (with bandgap $E_{g1}$ which is narrower than $E_{g2}$), and a P+ region 1312 (with bandgap $E_{g3}$). The wider bandgap composition $E_{g2}$ can be grown first, followed by the narrower bandgap $E_{g1}$, resulting in the multi-layer structure shown, where the $E_{g2}$ composition includes the N+ contact layer, which can be of the $E_{g2}$ composition or of even larger bandgap. The narrower bandgap $E_{g1}$ layer is preferably capped with a P+ contact layer of wider bandgap $E_{g3}$, so as to avoid dark current from this contact. Mesas 1314 can be then etched into the P− region to provide individual diodes for subsequent bump bonding and sequential address for 2-color operation.

Figure 14:
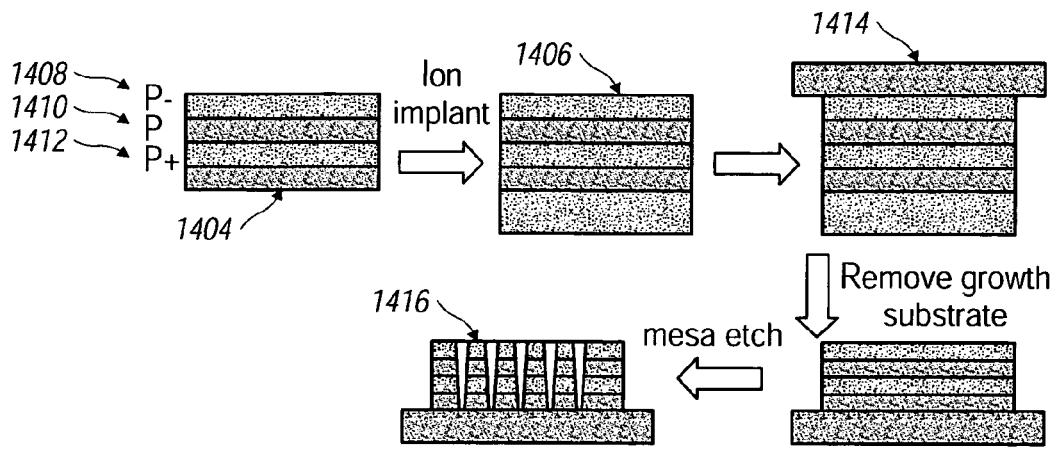
FIG. 14 shows processing steps for creating a diode consistent with preferred embodiments of the present innovations.

FIG. 14 shows another example implementation for the 2-color concept. In this example, the P+ $E_{g3}$ layer 1412 is grown first, followed by the P $E_{g1}$ layer 1410, and then P− $E_{g2}$ layer 1408. The P− layer 1408 can then be subjected to an ion implant to create the N+ layer 1406 and the structure is preferably transferred to a sacrificial IR transparent substrate 1414 as shown. Growth substrate 1404 is then removed, and this is followed by mesa 1416 etching and bump bonding in preferred embodiments.

Figure 15:
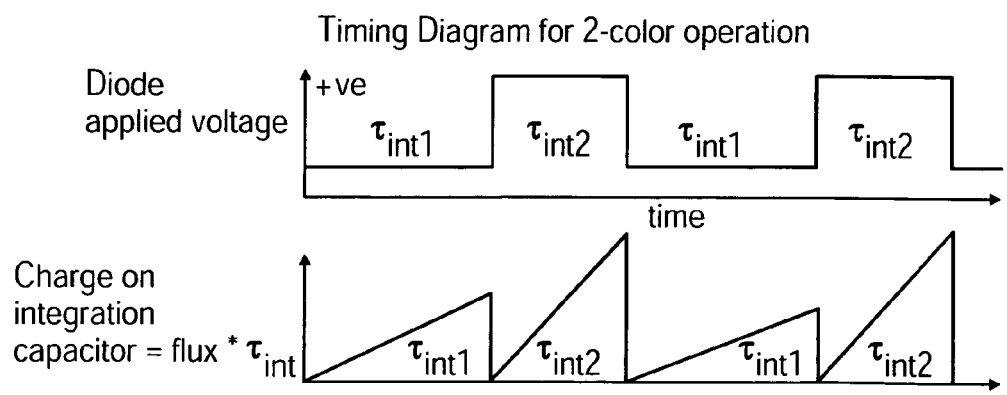
FIG. 15 shows a timing diagram for two color operation of a photodiode consistent with a preferred embodiment of the present innovations.

FIG. 15 shows a timing diagram for one embodiment of the 2-color device operation, consistent with a preferred embodiment. FIG. 15 shows two charts with parallel time axes. The top chart shows diode applied voltage, where the lower chart shows charge on integration capacitor. During the low bias condition charge is collected on the integration capacitor due to flux current from the wider bandgap region of the diode structure. This integrated charge is read out after $\tau_{int1}$ and the capacitor node is reset whilst the reverse voltage on the diode is reset to a large value. The capacitor then integrates charge due to flux current from both the wider bandgap and narrower bandgap regions of the diode. This integrated charge is read out after $\tau_{int2}$ and the node resets again whilst the diode is reset to the low reverse bias voltage. The cycle then repeats. The second color flux is obtained by subtraction of the two readings weighted by the appropriate integration times. Possible errors due to non-simultaneity can be reduced by using more rapid addressing of the integration capacitor to achieve pseudo-simultaneous operation. In preferred embodiments, a lower limit on the integration times used is set by the quiescent charge that accumulates in the narrower bandgap region during $\tau_{int1}$. This is determined by the minority carrier lifetime in that region, $\tau_{min}$. For minimum corruption of narrow bandgap signals $\tau_{int2} \gg \tau_{min}$, which is typically a few microseconds.

Integration of the signals can take different forms, including even or uneven accumulation during the two integration times. For example, if the two wavelengths of detected light are of different fluxes, the weaker flux light period can be accumulated for a longer period. Other variations in this procedure can also be implemented within the context of these innovations.

In another embodiment, the quiescent charge can be avoided by a suitable time lapse between the application of the larger reverse bias and the store of the integration period.

One primary advantage of the single contact mode of operation of the SAD diode is the simplicity of the structure, and that there is no region of diode forward bias within the focal plane unit cell, which is very different to the present state of the art in single contact heterojunction detection, which typically utilizes back-to-back diodes with a floating base. One issue with the back-to-back diode architecture is that the forward-biased wider bandgap diode acts as an efficient emitter of bandgap radiation, resulting in crosstalk into the reverse-biased narrower bandgap diode. There is no such interaction between the diode regions in the SAD diode.

Most or all of the commentary concerning the SAD diode concept described above is appropriate for the 2-color SAD concept. Some differences with the 2-color diode are that:

1. The incident photon flux must strike the shorter of the two cutoff wavelength regions (bandgap $E_{g2}$) first so that the longer cutoff wavelength can pass through without absorption and be detected by the region of bandgap $E_{g1}$.
2. The region of bandgap Eg2 must be of sufficient thickness so as to absorb a significant fraction of the incident photon flux with energies >$E_{g2}$. The absorption coefficient of HgCdTe as a function of photon energy E is given by $\alpha=6\times10^4[E(E-E_g)]^{1/2}$. The thickness W of region $E_{g2}$ is preferably ~$1/\alpha$, which is typically on the order of a wavelength of the IR radiation.

3. The bandgap Eg2 is determined by the second color photon energy, and not by dark current considerations.

4. The operating temperature of the 2-color SAD diode is not limited by the condition $N_{maj}>n_i$, which is purely a condition on dark current minimization at lower temperatures.

Figure 16:
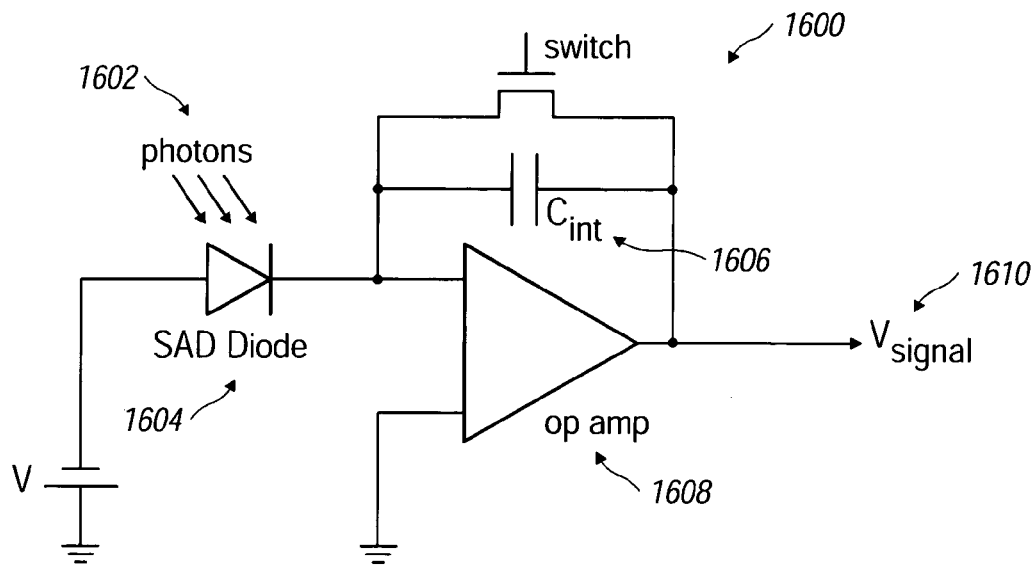
FIG. 16 shows a charge trans-impedance amplifier input circuit consistent with implementing a preferred embodiment of the present innovations.

FIG. 16 shows a charge trans-impedance amplifier input circuit 1600 consistent with implementing a preferred embodiment of the present innovations. This example depicts one example of the ROIC's input circuit stage, which can be used to read the output of the photodiode embodiments described above. The photodiode 1604, under an applied bias voltage V, incrementally passes charge in response to photon flux 1602. This charge is integrated on capacitor $C_{int}$ 1606, which can be reset at the end of each integration time. Op amp 1608 accordingly provides an output voltage $V_{signal}$ at terminal 1610, which represents the charge seen on the diode 1604 during the current integration time. This analog stage topology is merely exemplary, and can of course be modified with various additional components for amplification or noise reduction, or different circuit topologies can be used.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Note that the single-contact structure of the present application can be used in combination with, or separately from, the teachings in the priority application which relate to reduced dark current. The considerations related to dark current reduction are very extensively discussed in the present application, but these considerations are NOT necessary for practice of most of the claimed inventions. In particular, two-color operation can be achieved if the height of the potential barrier is only a few kT, without satisfying the more stringent conditions which fully optimize dark current.

Though multiple architectures have been described (e.g., the P/N/N+, and the P/P−/N+), the present innovations can be implemented with different material arrangements and relative doping concentrations than have been used as examples. Further, the materials and compositions given herein as examples are not the only possible implementations consistent with these innovative ideas. For example, HgCdTe has been used as exemplary, but other materials that conform to the innovations herein described can be used as well.

The means of arranging the individual diodes into an imager or detector are also not intended to limit application of these innovations. Any architecture or arrangement that incorporates the presently disclosed innovations is within contemplation of the present inventions.

The fabrication process used to create a device consistent with these innovations can also vary. For example, graded compositions can be obtained in a variety of ways, including but not limited to MBE (molecular beam epitaxy) and metal organic chemical vapor deposition (MOCVD), for example.

The relative positions of various layers, contacts, dopants, and other aspects of the fabricated device can vary yet remain within the scope of the present innovations.

The specific use of the present innovations mentioned herein are also only examples, and are not intended to limit the scope of the present innovations. For example, though IR detection is a contemplated example, other uses for the structures or methods or systems disclosed herein could be found without deviating from the present innovative concepts.

Additional general background, which helps to show variations and implementations, may be found in the following publications, all of which are hereby incorporated by reference:

"Microchip Fabrication," Peter Van Zant, McGraw Hill, 2000;

"HgCdTe heterojunctions," Peter R. Bratt, J. Vac. Sci. Technol. A 1(3) July-September 1983;

"Common Anion Heterojunctions: CdTe—CdHgTe," Migliorato and White, Solid-State Electronics Vol. 26, No. 1, pp. 65-69, 1983;

"Mercury Cadmium Telluride for High Operating Temperature Infrared Detectors," Ashokan, et al; Arias, J M; Zandian, M; Williams, G M; Blazejewski, E R; Dewames, R E; Pasko, J G (1991):

HgCdTe dual-band infrared photodiodes grown by molecular-beam epitaxy (technical note), J. Appl. Phys. 70(8, 15 October), 4620-4622;

Blazejewsli, E R; Arias, J M; Williams, G M; McLevige, W; Zandian, M; Pasko, J (1992): Bias-switchable dual-band HgCdTe infrared photodetector. J. Vac. Sci. Technol. B 10(4, July-August), 1626-1632;

Tennant, W E; Thomas, M; Kozlowski, L J; McLevige, W V; Edwall, D D; Zandian, M; Spariosu, K; Hildebrandt, G; Gil, V; Ely, P (2001): A Novel Simultaneous Unipolar Multispectral Integrated Technology (SUMIT) Approach for HgCdTe IR Detectors and Focal Plane Arrays. J. Electron. Mater. 30(6), 590-594;

Almeida, L A; Thomas, M; Larsen, W; Spariosu, K; Edwall, D D; Benson, J D; Mason, W; Stoltz, A J; Dinan, J H (2002): Development and Fabrication of Two-Color Mid- and Short-Wavelength Infrared Simultaneous Unipolar Multispectral Integrated Technology Focal-Plane Arrays. J. Electron. Mater. 31(7), 669-676;

Rajavel, R; Jamba, D; Johnson, S (1997): Molecular Beam Epitaxial Growth and Performance of Integrated Two-Color HgCdTe Detectors Operating in the Mid-Wave Infrared Band. J. Electron. Mater. 26(6, 01 June), 476;

Mitra, P; Barnes, S; Musicant, B (1997): MOCVD of Bandgap-Engineered HgCdTe p-n-N-P Dual-Band Infrared Detector Arrays. J. Electron. Mater. 26(6, 01 June), 482;

Johnson, S; Johnson, J; Gorwitz, M (2000): HgCdZnTe Quaternary Materials for Lattice-Matched Two-Color Detectors. J. Electron. Mater. 29(6, 01 June), 680;

Smith, E P G; Pham, L T; Venzor, G M; Norton, E M; Newton, M D; Goetz, P M; Randall, V K; Gallagher, A M; Pierce, G K; Patten, E A; Coussa, R A; Kosai, K; Radford, W A; Giegerich, L M; Edwards, J M; Johnson, S M; Baur, S T; Roth, J A; Nosho, B; De Lyon, T J; Jensen, J E; Longshore, R E (2004): HgCdTe Focal Plane Array for Dual Color Mid- and Long-Wavelength Infrared Detection, J. Electron Mater. 33, June, 509-516;

Coussa, R A; Gallagher, A M; Kosai, K; Pham, L T; Pierce, G K; Smith, E P; Venzor, G M; De Lyon, T J; Jensen, J E; Nosho, B Z; Roth, J A; Waterman, J R (2004): Spectral Crosstalk by Radiative Recombination in Sequential-Mode, Dual Mid-Wavelength Infrared Band HgCdTe Detectors. J. Electron. Mater. 33(6, 1 June), 517-525;

Buell, A A; Pham, L T; Newton, M D; Venzor, G M; Norton, E M; Smith, E P; Varesi, J B; Harper, V B; Johnson, S M; Coussa, R A; De Leon, T; Roth, J A; Jensen, J E (2004): Physical Structure of Molecular-Beam Epitaxy Growth Defects in HgCdTe and Their Impact on Two-Color Detector Performance. J. Electron. Mater. 33(6, 1 June), 662-666;

Ballet, P; Noel, F; Pottier, F; Plissard, S; Zanatta, J P; Baylet, J; Gravrand, O; De Borniol, E; Martin, S; Castelein, P; Chamonal, J P; Million, A; Destefanis, G (2004): Dual-Band Infrared Detectors Made on High-Quality HgCdTe Epilayers Grown by Molecular Beam Epitaxy on CdZnTe or CdTe/Ge Substrates. J. Electron. Mater. 33(6, 1 June), 667-672;

Baylet, J; Gravrand, O; Laffosse, E; Vergnaud, C; Ballerand, S; Aventurier, B; Deplanche, J C; Ballet, P; Castelein, P; Chamonal, J P; Million, A; Destefanis, G (2004): Study of the Pixel-Pitch Reduction for HgCdTe Infrared Dual-Band Detectors. J. Electron. Mater. 33(6, 1 June), 690-700;

Sood, A K; Egerton, J E; Puri, Y R; Bellotti, E; D'Orsogna, D; Becker, L; Balcerak, R; Freyvogel, K; Richwine, R (2005): Design and Development of Multicolor MWIR/LWIR and LWIR/VLWIR Detector Arrays. J. Electron. Mater. 34(6, June), 909-912;

D. K. Blanks, J. D. Beck, M. A. Kinch and L. Colombo, J. Vac. Sci. Technol. A6, 2760 (1988);

U.S. Pat. No. 5,189,297;
U.S. Pat. No. 5,279,974;
U.S. Pat. No. 6,049,116;
U.S. Pat. No. 6,603,184; and
U.S. Pat. No. 4,961,098.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A multicolor photodetection structure, comprising:
    a monolithic semiconductor heterostructure defining a photodiode, the photodiode comprising first and second photoabsorption regions of two different bandgaps and an N+ region formed on the first photoabsorption region, the first photoabsorption region having a first conductivity type and the second photoabsorption region having a second conductivity type;
    a first contact electrically connected to the N+ region;
    a backside contact electrically connected to the second photoabsorption region; and
    circuitry electrically connected to the N+contact region via the first contact and electrically connected to the second photoabsorption region via the backside contact,
    wherein the circuitry:
    in a first mode, biases, via only the first contact and the backside contact, both said photoabsorption regions to collect photocarriers therefrom, without forward bias on either; and
    in a second mode, biases, via only the first contact and the backside contact, only one of said photoabsorption regions to collect photocarriers therefrom, without forward bias on either.

2. The structure of claim 1, wherein photons strike the first photoabsorption region and thereafter strike the second photoabsorption region; and wherein higher energy photons are absorbed in the first region and lower energy photons are absorbed in the second region.

3. The structure of claim 2, wherein the first region is at least as thick as the wavelength of the lowest energy photons absorbed by the multicolor photodetection structure.

4. The structure of claim 2, wherein the circuitry toggles between the first and second modes.

5. The structure of claim 1, wherein the first photoabsorption region is an N− region, and the second photoabsorption region is a P region.

6. The structure of claim 5, wherein the depletion region of the photodiode is confined substantially in the first photoabsorption region.

7. The structure of claim 1, wherein the first photoabsorption region is a P− region, and the second photoabsorption region is a P region.

8. A monolithic multicolor infrared photodetection structure, comprising:
    a monolithic semiconductor heterostructure defining a photodiode, the photodiode comprising first and second photoabsorption regions of two different bandgaps, and an N+ region formed on the first photoabsorption region, the first photoabsorption region having a first conductivity type and the second photoabsorption region having a second conductivity type;
    control circuitry which is bonded to the monolithic heterostructure and electrically connected to the N+ region and the second photoabsorption region, but constructed from a different semiconductor material, and which operates the photodiode in reverse bias via only the electrical connections to the N+ region and the second photoabsorption region to obtain different signals from the photodiode corresponding to the two different bandgaps,
    wherein said electrical connections to the N+ region and the second photoabsorption region comprises a first contact and a backside contact;
    wherein the control circuitry:
    in a first mode, reverse biases, via only the first contact and the backside contact, both said photoabsorption regions to collect photocarriers therefrom; and
    in a second mode, reverse biases, via only the first contact and the backside contact, only one of said photoabsorption regions to collect photocarriers therefrom.

9. The structure of claim 8, wherein the photoabsorption regions are positioned so that incoming photons enter the first photoabsorption region before the second photoabsorption region, and wherein the first photoabsorption region has a wider bandgap than the second photoabsorption region.

10. The structure of claim 8, wherein the first photoabsorption region is an N region, and the second photoabsorption region is a P region.

11. The structure of claim 8, wherein the first photoabsorption region is a P− region, and the second photoabsorption region is a P region.

* * * * *